United States Patent
Grannen et al.

(10) Patent No.: US 10,432,162 B2
(45) Date of Patent: Oct. 1, 2019

(54) ACOUSTIC RESONATOR INCLUDING MONOLITHIC PIEZOELECTRIC LAYER HAVING OPPOSITE POLARITIES

(71) Applicant: Avago Technologies General IP (Singapore) Pte. Ltd., Singapore (SG)

(72) Inventors: Kevin J. Grannen, Thornton, CO (US); Chris Feng, Fort Collins, CO (US); John Choy, Westminster, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 396 days.

(21) Appl. No.: 15/086,397

(22) Filed: Mar. 31, 2016

(65) Prior Publication Data
US 2017/0288628 A1  Oct. 5, 2017

(51) Int. Cl.
| | |
|---|---|
| C23C 14/00 | (2006.01) |
| C23C 14/06 | (2006.01) |
| C23C 14/16 | (2006.01) |
| H03H 3/02 | (2006.01) |

(52) U.S. Cl.
CPC ........... *H03H 3/02* (2013.01); *C23C 14/0057* (2013.01); *C23C 14/0617* (2013.01); *C23C 14/0641* (2013.01); *C23C 14/165* (2013.01); *H03H 2003/021* (2013.01)

(58) Field of Classification Search
CPC ............ C23C 14/0057; C23C 14/0641; C23C 14/0617; C23C 14/165; H01L 21/02192; H03H 3/02
See application file for complete search history.

(56) References Cited

U.S. PATENT DOCUMENTS

| | | | |
|---|---|---|---|
| 5,587,620 A | 12/1996 | Ruby et al. |
| 5,873,153 A | 2/1999 | Ruby et al. |
| 6,107,721 A | 8/2000 | Lakin |
| 6,384,697 B1 | 5/2002 | Ruby |
| 6,507,983 B1 | 1/2003 | Ruby et al. |

(Continued)

OTHER PUBLICATIONS

Ruffner, J.; Clem, P.; Tuttle, B.;Dimos, D.; Gonzales, D. Effect of substrate composition on the piezoelectric response of reactively sputtered AlN thin films. Thin Solid Films, p. 256-261 [Online] (Year: 1999).*

(Continued)

*Primary Examiner* — Michael A Band

(57) ABSTRACT

A method is provided for forming a piezoelectric layer during a corresponding deposition sequence. The method includes sputtering aluminum nitride onto a sputtering substrate inside a reaction chamber having a gas atmosphere, the gas atmosphere initially including nitrogen gas and an inert gas, causing growth of the piezoelectric layer with a polarity in a negative direction. The method further includes adding a predetermined amount of oxygen containing gas to the gas atmosphere over a predetermined period of time, while continuing the sputtering of the aluminum nitride onto the sputtering substrate during a remainder of the deposition sequence, such that the piezoelectric layer is monolithic. The predetermined amount of oxygen containing gas causes the polarity of the aluminum nitride piezoelectric layer to invert from the negative direction to a positive direction, opposite the negative direction.

8 Claims, 6 Drawing Sheets

(56) References Cited

U.S. PATENT DOCUMENTS

| | | | |
|---|---|---|---|
| 6,927,651 | B2 | 8/2005 | Larson, III et al. |
| 6,975,183 | B2 | 12/2005 | Aigner et al. |
| 7,275,292 | B2 | 10/2007 | Ruby et al. |
| 7,280,007 | B2 | 10/2007 | Feng et al. |
| 7,345,410 | B2 | 3/2008 | Grannen et al. |
| 7,358,831 | B2 | 4/2008 | Larson, III et al. |
| 7,388,454 | B2 | 6/2008 | Ruby et al. |
| 7,629,865 | B2 | 12/2009 | Ruby |
| 8,030,823 | B2 | 10/2011 | Sinha et al. |
| 8,916,942 | B2 | 12/2014 | Pensala et al. |
| 8,981,876 | B2 | 3/2015 | Jamneala et al. |
| 9,136,819 | B2 | 9/2015 | Grannen et al. |
| 9,225,313 | B2 | 12/2015 | Bradley et al. |
| 9,243,316 | B2 | 1/2016 | Larson, III et al. |
| 2004/0246075 | A1 | 12/2004 | Bradley et al. |
| 2008/0241363 | A1 | 10/2008 | Tsukamoto |
| 2010/0327697 | A1 | 12/2010 | Choy et al. |
| 2010/0327994 | A1 | 12/2010 | Choy et al. |
| 2011/0180391 | A1 | 7/2011 | Larson, III et al. |
| 2012/0177816 | A1 | 7/2012 | Larson, III et al. |
| 2013/0214643 | A1 | 8/2013 | Zuo et al. |
| 2015/0240349 | A1 | 8/2015 | Grannen et al. |
| 2015/0311046 | A1 | 10/2015 | Yeh et al. |

OTHER PUBLICATIONS

O. Menendez et al. "Procedure for the Design of Ladder Baw Filters Taking Electrodes Into Account", Progress in Electromagnetics Research Letters, vol. 7, 2009, pp. 127-137.

B. J. Rodriguez et al., "Measurement of the Effective Piezoelectric Constant of Nitride Thin Films and Heterostructures Using Scanning Force Microscopy", Mat. Res. Soc. Symp. Proc. vol. 693, 2002, pp. 19.9.1-19.9.6.

Toshihiro Kamohara et al., "Influence of sputtering pressure on polarity distribution of aluminum nitride thin films", Applied Physics Letters 89, 2006, 243507, pp. 243507-1 to 243507-3.

Morito Akiyama et al., "Influence of oxygen concentration in sputtering gas on piezoelectric response of aluminum nitride thin films", Applied Physics Letters 93, 021903, 2008, pp. 021903-1 to 021903-3.

E. Milyutin et al., "Sputtering of (001)AlN thin films: Control of polarity by a seed layer", J. Vac. Sci. Technol. B 28, (2010), pp. L60-L63.

T. Harumoto et al., "Controlled polarity of sputter-deposited aluminum nitride on metals observed by aberration corrected scanning transmission electron microscopy", Journal of Applied Physics 113, 084306 (2013), pp. 084306-1 to 084306-7.

Masashi Suzuki et al., "Polarity-inverted ScAlN film growth by ion beam irradiation and application to overtone acoustic wave (000-1)/(0001) film resonators", Applied Physics Letters 104, 172905 (2014), pp. 172905 to 172905-4.

Masashi Suzuki et al, "Second overtone mode (0001)/(000-1) ScAlN multilayer FBARs fabricated by anode RF bias deposition", Proceedings of Symposium on Ultrasonic Electronics, vol. 35 (2014), Dec. 3-5, 2014, pp. 81-82.

John D. Larson, III et al., "Characterization of Reversed c-axis AlN Thin Films", 2010 IEEE International Ultrasonics Symposium Proceedings, pp. 1054-1059.

\* cited by examiner

ACOUSTIC RESONATOR INCLUDING MONOLITHIC PIEZOELECTRIC LAYER HAVING OPPOSITE POLARITIES

BACKGROUND

Acoustic transducers generally convert electrical signals to acoustic signals (sound waves) and convert received acoustic waves to electrical signals via inverse and direct piezoelectric effect. There are a number of types of acoustic transducers including acoustic resonators, such as bulk acoustic wave (BAW) resonators and surface acoustic wave (SAW) resonators. BAW resonators, in particular, include thin film bulk acoustic resonators (FBARs), which generally have acoustic stacks formed over a substrate cavity, and solidly mounted resonators (SMRs), which generally have acoustic stacks formed over an acoustic mirror (e.g., a distributed Bragg reflector (DBR)). BAW resonators may be used for electrical filters and voltage transformers, for example, in a wide variety of electronic applications, such as cellular telephones, personal digital assistants (PDAs), electronic gaming devices, laptop computers and other portable communications devices.

Generally, a BAW resonator has an acoustic stack comprising a layer of piezoelectric layer between two conductive plates (e.g., top and bottom electrodes). The piezoelectric layer may be a thin film of various materials, such as aluminum nitride (AlN), zinc oxide (ZnO), or lead zirconate titanate (PZT), for example. Piezoelectric thin films made of AlN are advantageous since they generally maintain piezoelectric properties at high temperatures (e.g., above 400° C.). Indeed, BAW resonators have experienced mainstream adoption and success in wireless communications due in large part to the characteristics of thin film ALN piezoelectric layers. However, a BAW resonator including a piezoelectric layer formed of AlN has a resonance frequency limited to less than about 3 GHz, as a practical matter, in order to maintain acceptable device performance and reliability.

Thin film AlN is typically grown in a c-axis orientation perpendicular to a substrate surface using reactive magnetron sputtering. In this process, an aluminum (Al) target is sputtered by inert gas atoms, such as argon (Ar) atoms, in the presence of nitrogen (N) gas. Oriented, stoichiometric and piezoelectric AlN grows on any number of substrates ranging from silicon (Si) and silicon carbide (SiC) to metals, such as molybdenum (Mo) and tungsten (W), for example. An AlN thin film may be deposited with various specific crystal orientations, including a wurtzite (0001) B4 structure, for example, which consists of a hexagonal crystal structure with alternating layers of aluminum (Al) and nitrogen (N). The piezoelectric nature of AlN stems from the c-axis orientation and the nature of the Al—N bonds of the AlN crystal lattice. That is, due to the nature of the Al—N bonding in the wurtzite structure, electric field polarization is present in the AlN crystal, resulting in the piezoelectric properties of the AlN thin film To exploit this polarization and the corresponding piezoelectric effect, one must synthesize the AlN with a specific crystal orientation.

FIGS. 1A and 1B are perspective views of illustrative models of common wurtzite structures of piezoelectric materials. Generally, for purpose of discussion, polarization of a piezoelectric material is defined as being in the "positive direction" from cation (e.g., Al atoms) to anion (e.g., N atoms) along the crystallographic axis points. Accordingly, as shown in FIG. 1A, when the first layer of the crystal lattice 100A is an Al layer and second layer in an upward direction (in the depicted orientation) is an N layer, the piezoelectric material including the crystal lattice 100A is said to have "positive polarity," as indicated by the upward pointing arrow 150A. Conversely, as shown in FIG. 1B, when the first layer of the crystal lattice 100B is an N layer and second layer in an upward direction is an Al layer, the piezoelectric material including the crystal lattice 100B is said to have "negative polarity," as indicated by the downward pointing arrow 150B. Notably, the orientation shown in FIG. 1B is the more standard convention in the field of polar nitride materials. A piezoelectric material having a single polarity (positive or negative) is limited in the resonance frequency at which it is able to perform without compromising various characteristics, such as coupling coefficient $kt^2$, for example.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figures 1A, 1B:
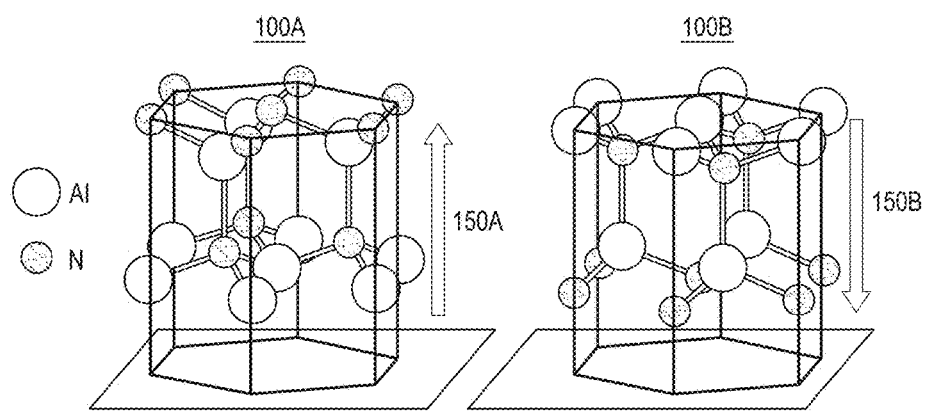
FIG. 1A is a perspective view of an illustrative model of a crystal structure of aluminum nitride (AlN) in piezoelectric material having positive polarization.
FIG. 1B is a perspective view of an illustrative model of a crystal structure of AlN in piezoelectric material having negative polarization.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one of ordinary skill in the art. For example, "approximately the same" means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Aspects of the present teachings are relevant to components of BAW resonator devices and filters, their materials and their methods of fabrication. Various details of such devices and corresponding methods of fabrication may be found, for example, in one or more of the following U.S. patent publications: U.S. Pat. No. 6,107,721 to Lakin; U.S. Pat. Nos. 5,587,620, 5,873,153, 6,507,983, 6,384,697, 7,275,292, 7,629,865 and 7,388,454 to Ruby et al.; U.S. Pat. No. 7,280,007 to Feng, et al.; U.S. Pat. No. 8,981,876 to Jamneala et al.; U.S. Patent App. Pub. Nos. 2010/0327697 and 2010/0327994 to Choy et al.; and U.S. Patent App. Pub. Nos. 2011/0180391 and 2012/0177816 to Larson, et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

Generally, according to various embodiments, a method is provided for forming a piezoelectric layer during a corresponding deposition sequence. The method includes sputtering aluminum nitride or aluminum nitride doped with a rare earth element onto a sputtering substrate inside a reaction chamber having a gas atmosphere, the gas atmosphere initially including nitrogen gas and an inert gas, causing growth of the piezoelectric layer with a polarity in a negative direction. The method further includes adding a predetermined amount of oxygen containing gas to the gas atmosphere over a predetermined period of time, while continuing the sputtering of the aluminum nitride or the aluminum nitride doped with the rare earth element onto the sputtering substrate during a remainder of the deposition sequence, such that the piezoelectric layer is monolithic. The predetermined amount of oxygen containing gas causes the polarity of the piezoelectric layer to invert from the negative direction to a positive direction, which is opposite to the negative direction. This results in no discernible interface in the piezoelectric layer where the polarity of the piezoelectric layer inverts from the negative direction to the positive direction.

According to a representatively embodiment, a method is provided for forming a piezoelectric layer during a corresponding deposition sequence. The method includes sputtering aluminum nitride (AlN) onto a sputtering substrate inside a reaction chamber having a gas atmosphere, the gas atmosphere initially comprising nitrogen ($N_2$) gas and an inert gas, causing growth of the piezoelectric layer with a polarity in a negative direction; and adding a predetermined amount of diatomic or triatomic oxygen containing gas to the gas atmosphere over a predetermined period of time, while continuing the sputtering of the AlN onto the sputtering substrate during a remainder of the deposition sequence, such that the piezoelectric layer is monolithic. The predetermined amount of oxygen containing gas causes the polarity of the AlN piezoelectric layer to invert from the negative direction to a positive direction, opposite the negative direction. As a result of the method, there is no discernible interface in the piezoelectric layer where the polarity of the piezoelectric layer inverts from the negative direction to the positive direction.

Figure 2:
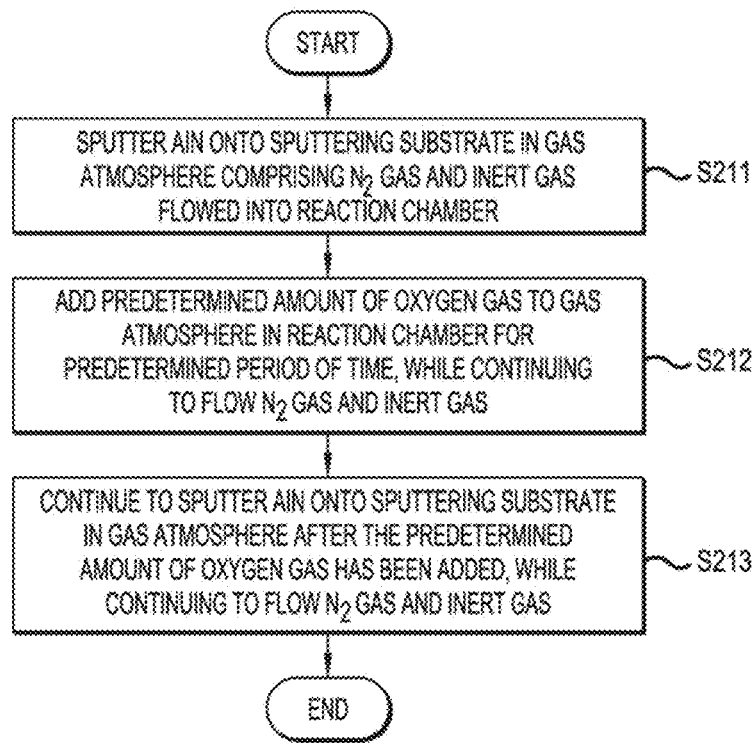
FIG. 2 is a flow diagram showing a method of sputtering a monolithic piezoelectric layer having opposite polarities in a continuous deposition sequence, according to a representative embodiment.

FIG. 2 is a flow diagram showing a method of forming a monolithic piezoelectric layer having opposite polarities in a continuous deposition sequence, according to a representative embodiment.

Referring to FIG. 2, in block S211, aluminum nitride (AlN) is reactively sputtered onto a sputtering substrate inside a reaction chamber during a first phase of the deposition sequence. The reaction chamber may be part of a planar magnetron system, an example of which is described with reference to FIG. 6, below. The reaction chamber has a gas atmosphere that initially includes nitrogen ($N_2$) gas and an inert gas, such as argon (Ar), for example, which continuously flow into reaction chamber in approximately a 3:1 ratio of nitrogen to argon throughout the deposition sequence. This first phase causes growth on the sputtering substrate of a piezoelectric layer having a polarity in a negative direction. In various embodiments, the sputtering substrate may be formed of metal, such as molybdenum (Mo) and./or tungsten (W), typically used for BAW resonator electrodes, for example, although other sputtering substrates may be used, such as other metals, silicon (Si) and/or silicon carbide (SiC), without departing from the scope of the present teachings.

In block S212, a predetermined amount of oxygen containing gas is added to the gas atmosphere over a short predetermined period of time during a second phase of the deposition sequence. The oxygen containing gas may be diatomic or triatomic oxygen containing gas, such as oxygen ($O_2$) or ozone ($O_3$), for example, although other suitable oxygen containing gases may be used without departing from the scope of the present teachings. Notably, the sputtering of the AlN continues, without interruption and without alteration of the proportionate amounts of the nitrogen gas ($N_2$) and the inert gas, while the predetermined amount of oxygen containing gas flows into the gas atmosphere over the predetermined period of time. That is, in an embodiment, $N_2$ and Ar gas continue to flow into the reaction chamber in approximately a 3:1 ratio of $N_2$ to Ar, as oxygen (e.g., $O_2$ or $O_3$) gas also flows into the reaction chamber. In various embodiments, the predetermined amount of oxygen containing gas added to the gas atmosphere may be in a range from about 50 micromoles to about 5 millimoles, and the predetermined period of time during which the predetermined amount of oxygen containing gas is added to the gas atmosphere may be in a range from about one (1) second to about sixty (60) seconds, for example.

The addition of the predetermined amount of oxygen containing gas causes the polarity of the piezoelectric layer to invert from the negative direction to a positive direction, opposite the negative direction. In other words, when the piezoelectric layer is formed having a negative polarity (directed substantially toward the sputtering substrate) during the first phase of the deposition sequence, it flips to a positive polarity (directed substantially away from the sputtering substrate) at the second phase, and continues in this flipped polarity during the third phase of the deposition sequence. Further, the addition of the predetermined amount of oxygen containing gas over the predetermined period of time, during which the predetermined amount of oxygen containing gas is flowed into the reaction chamber, is timed to cause the polarity of the piezoelectric layer to invert approximately half way through the deposition sequence (ultimately resulting in half of the piezoelectric layer having a negative polarity and half of the piezoelectric layer having a positive polarity).

In block S213, after the predetermined period of time for adding the predetermined amount of oxygen gas ends, the AlN still continues to be reactively sputtered onto the sputtering substrate inside the reaction chamber during a third phase of the sputtering deposition. That is, in an embodiment, $N_2$ and Ar gas continue to flow into the reaction chamber, without interruption, in approximately a 3:1 ratio of $N_2$ to Ar for the remainder of the deposition sequence. Accordingly, due to the continuous nature of the deposition sequence, even while the oxygen containing gas is added and the polarity of the piezoelectric layer flips, the resulting piezoelectric layer is monolithic. That is, there is no discernible interface between the portion of the piezoelectric layer having the negative polarity and the portion of the piezoelectric layer having the positive (opposite) polarity. The term "discernible interface" in the context of this disclosure refers to an interface in the piezoelectric material visibly observable by physical analysis tools, such as scanning electron microscopy. Thus, it follows that the term "no discernible interface" means that there is no visible interface between the regions of opposite polarity in the piezoelectric layer that is observable at less than about 25000 times magnification (e.g., using a scanning electron microscope). Stated differently, due to the continuous nature of the deposition sequence, even as the oxygen containing gas is added and the polarity of the piezoelectric layer flips, the resulting piezoelectric layer is monolithic, in that there is no "distinct layer" of material separating the portion of the piezoelectric layer having the negative polarity and the portion of the piezoelectric layer having the positive polarity. Rather, the AlN material provides an uninterrupted, single piezoelectric layer. Although oxygen molecules are present in the vicinity of the finished piezoelectric layer where the polarity flips, these oxygen molecules are generally diffused, and not sufficiently organized into a material layer (e.g., aluminum oxynitride (AlON)) distinct from or otherwise separating the surrounding AlN piezoelectric material.

Further, as mentioned above, the addition of the predetermined amount of oxygen containing gas into the reaction chamber, which flows for the predetermined period of time, causes the polarity of the piezoelectric layer to invert approximately half way through the deposition sequence. This results in half of the monolithic piezoelectric layer having polarity in the negative direction and half of the monolithic piezoelectric layer having polarity in the positive direction. The half/half distribution of the opposite polarities is determined by depositing the AlN for equal amounts of time for the initial polarity portion and the flipped polarity portion of the piezoelectric layer, respectively. The amount of oxygen containing gas and the period of time over which the amount of oxygen containing gas is flowed into the reaction chamber needed to flip the polarity of the piezoelectric layer is determined empirically.

In an alternative embodiment, the AlN may be doped with one or more rare earth elements, such as scandium (Sc), erbium (Er) and/or yittrium (Y), for example, although other rare earth elements may be incorporated without departing from the scope of the present teachings. In an illustrative embodiment, aluminum nitride (AlN) doped with scandium (Sc) (e.g., AlScN) may be reactively sputtered onto the sputtering substrate inside the reaction chamber throughout the deposition sequence. The amount of Sc doping may be in a range of about 0.5 atomic percent to about 10 atomic percent Sc, for example. The resulting doped monolithic piezoelectric layer (with flipped polarity) may exhibit enhanced performance characteristics, such as increased piezoelectric coefficient $kt^2$, without changing dimensions of the monolithic piezoelectric layer, or exhibit substantially the same performance characteristics, while enabling reduction in the dimensions of the monolithic piezoelectric layer. Examples of doping with rare earth elements are provided by Grannen et al., U.S. Pat. No. 9,136,819 (issued Sep. 15, 2015), and Bradley et al., U.S. Pat. No. 9,225,313 (issued Dec. 29, 2015), both of which are hereby incorporated by reference in their entireties.

Figure 3:
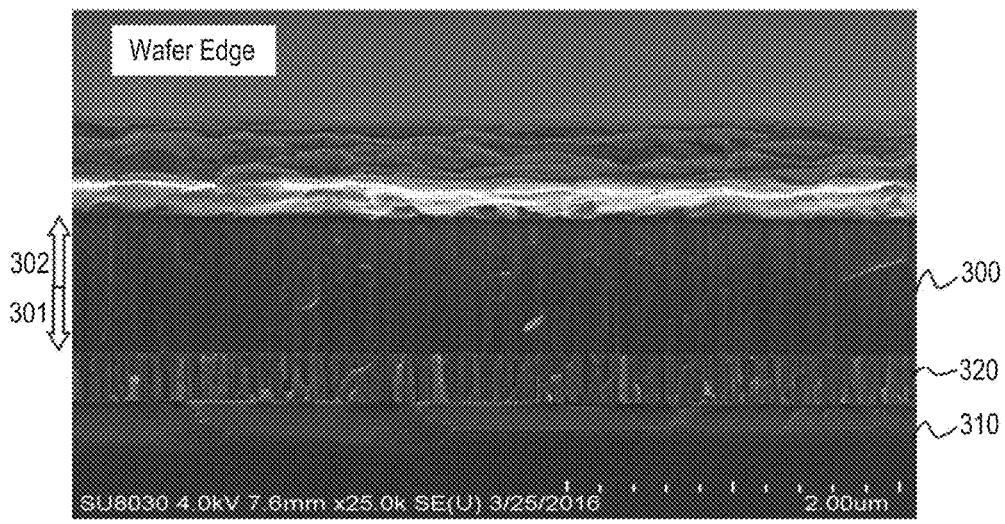
FIG. 3 is a cross-sectional view of a monolithic piezoelectric layer having opposite polarities, according to a representative embodiment.

FIG. 3 is a cross-sectional view of a monolithic piezoelectric layer having opposite polarities, according to a representative embodiment. Referring to FIG. 3, monolithic piezoelectric layer 300 has been formed according to the method described above with reference to FIG. 2. The monolithic piezoelectric layer 300 includes no discernible interface between a bottom half having negative polarity (indicated by arrow 301) and a top half having positive polarity (indicated by arrow 302).

The illustrative monolithic piezoelectric layer 300, fabricated according to the method of FIG. 2, for example, may be implemented as the piezoelectric layer as part of an acoustic stack of a BAW resonator. That is, the acoustic stack may include a bottom electrode 320 formed over resonator substrate 310 and an acoustic reflector, the monolithic piezoelectric layer 300 formed on the bottom electrode 320, and a top electrode ultimately formed on the monolithic piezoelectric layer 300. A passivation layer optionally may be formed on the top electrode, as well. The substrate, bottom electrode, piezoelectric layer, and top electrode may be substantially the same as described below with reference to FIGS. 4A to 4E, for example.

Notably, the monolithic piezoelectric layer 300, having a first half with negative polarity and a second half with positive polarity (opposite the negative polarity) and no discernible interface in between, causes the BAW resonator to resonate at a second harmonic of what would otherwise be its resonance frequency (e.g., as opposed to resonating at a first harmonic of the resonance frequency). Further, by resonating at the second harmonic, the BAW resonator with the monolithic piezoelectric layer 300 is able to resonate at a frequency over twice the resonance frequency of a BAW resonator with a piezoelectric layer having a single polarity, but the same thickness as the monolithic piezoelectric layer 300.

FIGS. 4A to 4E are simplified cross-sectional views of a BAW resonator corresponding to a method of fabricating a BAW resonator, including a monolithic piezoelectric layer having opposite polarities, according to a representative embodiment.

Figure 4A:
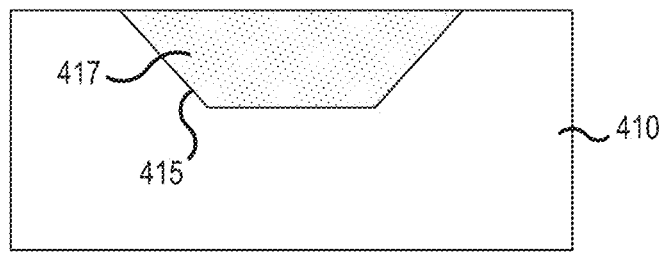
FIGS. 4A to 4E are simplified cross-sectional views of a BAW resonator corresponding to a method of fabricating a BAW resonator, including a monolithic piezoelectric layer having opposite polarities, according to a representative embodiment.

Referring to FIG. 4A, resonator substrate 410 is provided with a cavity 415 formed in a top surface thereof as an acoustic reflector. The resonator substrate 410 may be formed of various materials compatible with semiconductor processes, such as silicon (Si), gallium arsenide (GaAs), indium phosphide (InP), or the like. In an embodiment, the cavity 415 may be formed in the resonator substrate 410 by forming a mask pattern (e.g., of dielectric material) on the resonator substrate 410 that exposes part of the substrate surface, and then removing the exposed part of the resonator substrate 410 (e.g., by chemical etching through the mask pattern to the desired depth, thus forming the cavity 415. The cavity 415 is initially filled with a sacrificial material 417, indicated by dotted background, such as silicon dioxide ($SiO_2$), phosphorous silicon glass (PSG), or the like, as would be apparent to one of ordinary skill in the art. Various illustrative fabrication techniques for an air cavity in a substrate are described by Grannen et al., U.S. Pat. No. 7,345,410 (issued Mar. 18, 2008), which is hereby incorporated by reference in its entirety.

In alternative embodiments, an acoustic mirror, such as a distributed Bragg reflector (DBR) (not shown), may be formed as the acoustic reflector in place of the cavity 415, without departing from the scope of the present teachings. The DBR may be formed on the top surface of the resonator substrate 410, and may include one or more acoustic reflector layer pairs sequentially stacked on the resonator substrate 410. Each of the stacked acoustic reflector layer pairs includes two conductive layers, i.e., a first conductive layer with a first acoustic impedance and a second conductive layer with a second acoustic impedance stacked on the first conductive layer. Within each acoustic reflector layer pair of the DBR, the first acoustic impedance is less than the second acoustic impedance. Thus, for example, the first conductive layer may be formed of various low acoustic impedance materials, such as boron silicate glass (BSG), tetra-ethyl-ortho-silicate (TEOS), silicon oxide (SiOx) or silicon nitride (SiNx) (where x is an integer), carbon-doped silicon oxide (CDO), titanium (Ti) or aluminum, and each of the second conductive layers may be formed of various high acoustic impedance materials, such as tungsten (W), molybdenum (Mo), niobium molybdenum (NbMo), iridium (Ir), hafnium oxide ($HfO_2$), aluminum oxide ($Al_2O_3$), diamond or diamond-like carbon (DLC). Various illustrative fabrication techniques of acoustic mirrors are described by Larson III, et al., U.S. Pat. No. 7,358,831 (issued Apr. 15, 2008), which is hereby incorporated by reference in its entirety.

Figure 4B:
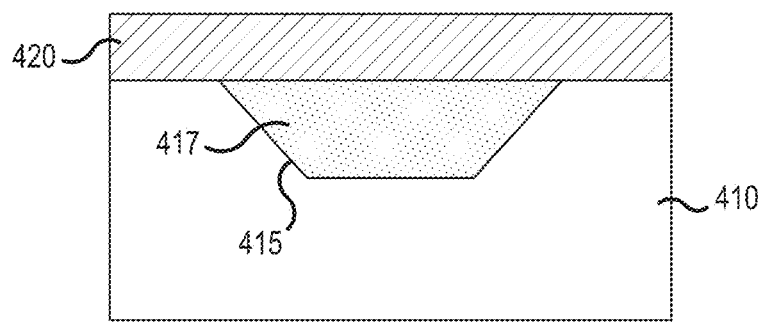

As shown in FIG. 4B, a first (bottom) electrode layer 420 is formed on the top surface of the resonator substrate 410 over the cavity 415. The first electrode layer 420 is formed of an electrically conductive material, such as a metal or combination of different metals, which is applied by sputtering, chemical vapor deposition (CVD) or atomic layer deposition (ALD), for example, although other application techniques may be incorporated without departing from the scope of the present teachings. Examples of electrically conductive material forming first electrode layer 420 include tungsten (W) and/or molybdenum (Mo).

Figure 4C:
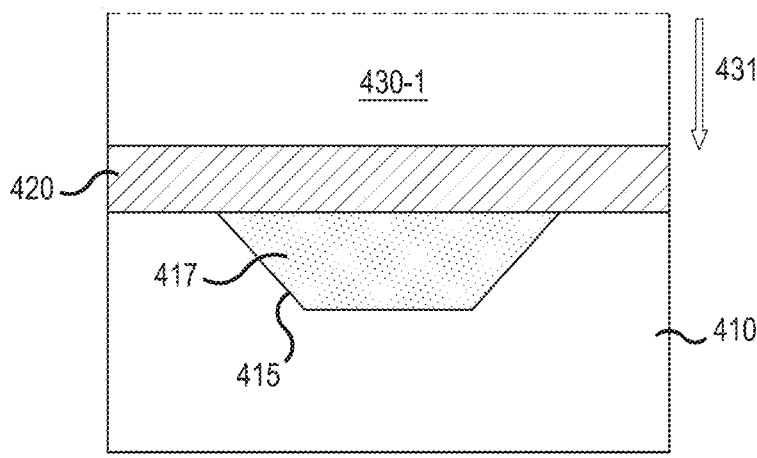
Figure 4D:
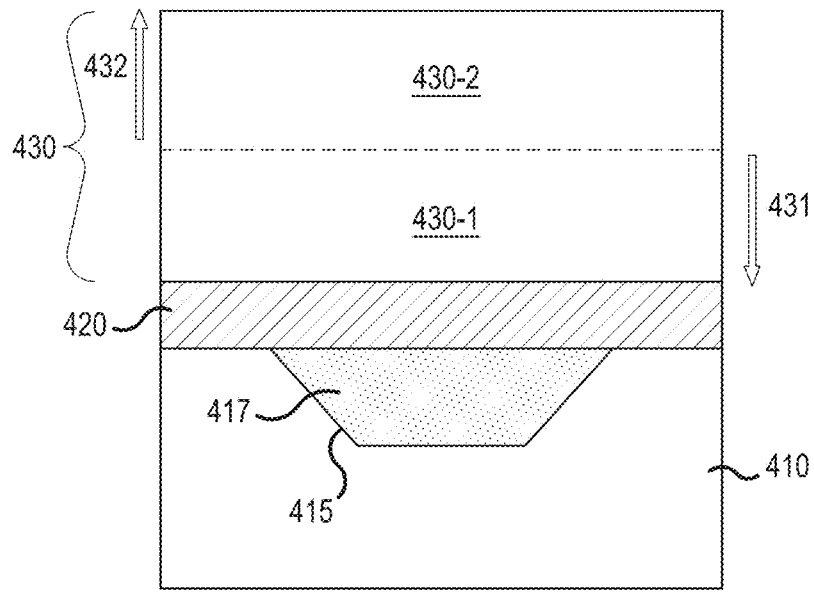

Referring to FIGS. 4C and 4D, a monolithic piezoelectric layer 430 is formed in a continuous sputtering deposition sequence, as described above with reference to FIG. 2, on the top surface of the first electrode layer 420. More particularly, FIG. 4C shows a bottom half 430-1 of the monolithic piezoelectric layer 430, which has a negative polarity directed substantially toward the first electrode layer 420 (indicated by downward pointing arrow 431), and FIG. 4D shows a top half 430-2 of the monolithic piezoelectric layer 430, which has a positive polarity directed substantially away from the first electrode layer 420 (indicated by upward pointing arrow 432).

For example, aluminum nitride (AlN) or aluminum nitride (AlN) doped with one or more rare earth elements (e.g., AlScN) is reactively sputtered onto the top surface of the first electrode layer 420 to provide the bottom half 430-1 of the monolithic piezoelectric layer 430 with the negative polarity. As discussed above, this sputtering occurs inside a reaction chamber having a gas atmosphere that initially includes nitrogen ($N_2$) gas and an inert gas, such as argon (Ar), for example, which continuously flow into reaction chamber in portions in an approximately 3 to 1 ratio of nitrogen to argon throughout the deposition sequence. A small predetermined amount of oxygen containing gas is then added to the gas atmosphere over a predetermined period of time, while the sputtering of the AlN or the doped AlN (e.g., AlScN) continues, without interruption and without alteration of the proportionate amounts of the $N_2$ gas and the inert gas through the remainder of the deposition sequence (even after the predetermined period of time ends). The addition of the predetermined amount of oxygen containing gas over the predetermined period of time results in flipping or inverting the polarity of the piezoelectric layer 430 at the half-way point, such that the top half 430-2 of the monolithic piezoelectric layer 430 has the positive polarity. The sputtering continues during and after the flipping of the polarity (without the flow of the oxygen containing gas) until formation of the monolithic piezoelectric layer 430 is complete, as shown in FIG. 4E.

Figure 4E:
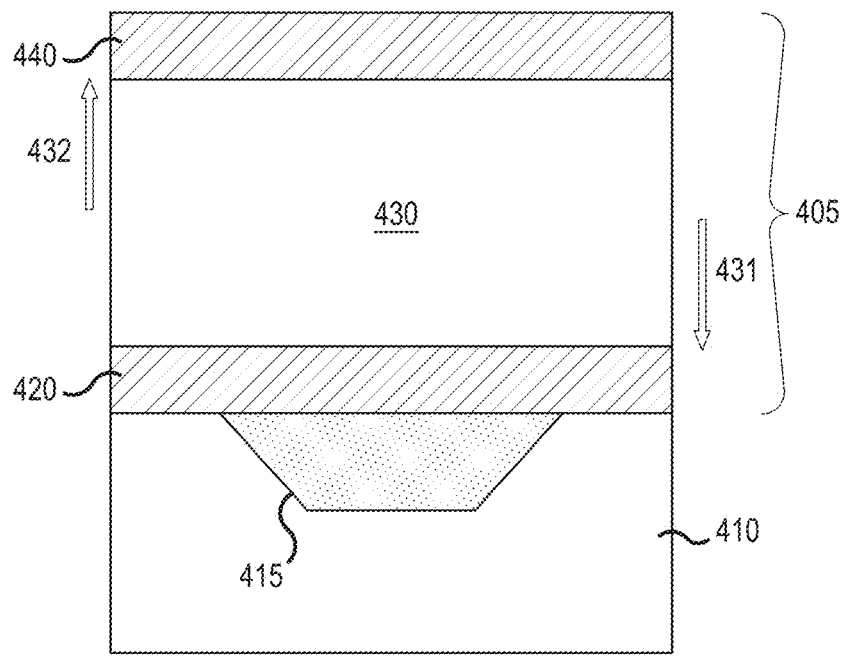

In addition, FIG. 4E shows formation of a second (top) electrode layer 440 on the top surface of the monolithic piezoelectric layer 430, forming an acoustic stack 405. The second electrode layer 440 is formed of an electrically conductive material, such as a metal or combination of different metals, which is applied by sputtering, CVD or ALD, for example, although other application techniques may be incorporated without departing from the scope of the present teachings. Examples of electrically conductive material forming second electrode layer 440 include tungsten (W) and/or molybdenum (Mo). In various embodiments, the second electrode layer 440 may be formed of the same or different materials and/or combinations of materials as the first electrode layer 420. Also shown in FIG. 4E is the release of the sacrificial material 417 from the cavity 415, indicated by the removal of the dotted background, making the cavity 415 an air cavity. The release of the sacrificial material 417 may be carried out using a suitable etchant, such as HF, for example.

Figure 5:
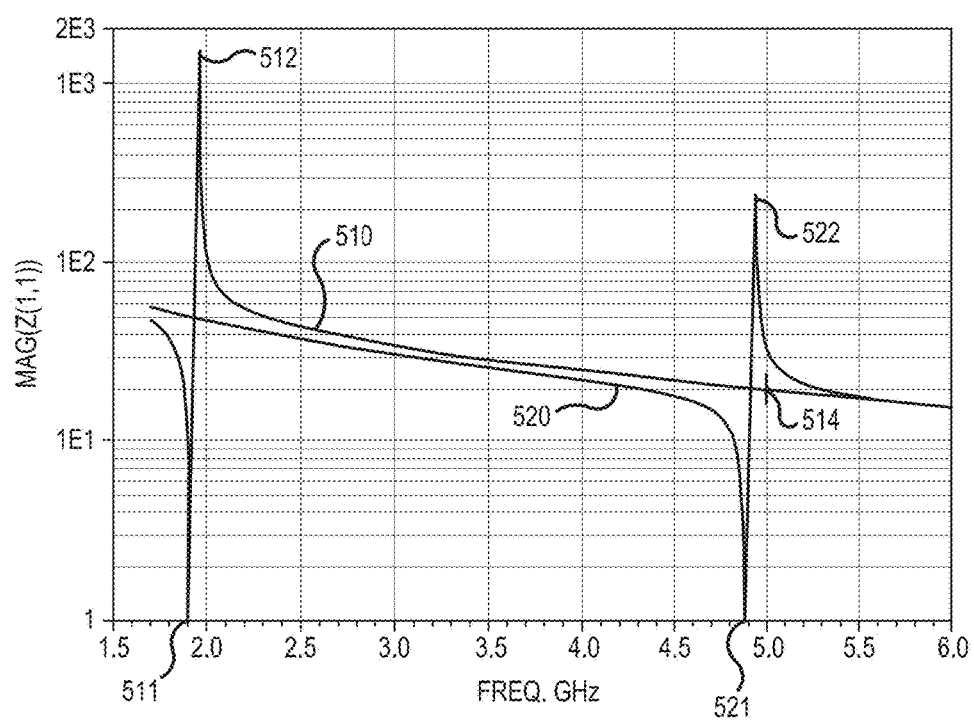
FIG. 5 is a graph showing admittance magnitude as a function of frequency for a BAW resonator including a piezoelectric layer having a single polarity formed by a conventional sputtering process and a BAW resonator including a monolithic piezoelectric layer having opposite polarities formed according to representative embodiments, for purposes of comparison.

FIG. 5 is a graph showing admittance magnitude as a function of frequency for a conventional BAW resonator including a piezoelectric layer having a single polarity formed by a conventional sputtering process and a BAW resonator including a monolithic piezoelectric layer having opposite polarities formed according to representative embodiments, for purposes of comparison. For purposes of illustration, the piezoelectric layers of both the conventional BAW resonator and the BAW resonator according to a representative embodiment are formed of AlN having a thickness of about 9,000 Å.

Referring to FIG. 5, resonance curve 510 indicates the admittance magnitude of a conventional BAW resonator including a piezoelectric layer having a single polarity (e.g., negative polarity in the depicted example), and resonance curve 520 indicates the admittance magnitude of a BAW resonator including a monolithic piezoelectric layer (e.g., monolithic piezoelectric layer 300 in FIG. 3 or monolithic piezoelectric layer 430 in FIG. 4E) having opposite polarities formed according to representative embodiments (e.g., negative polarity in the bottom half and positive polarity in the top half).

The resonance curve 510 shows the admittance magnitude having a low peak 511 (series resonance frequency $f_s$) at about 1.90 GHz and a high peak 512 (parallel resonance frequency $f_p$) at about 1.96 GHz. The resonance frequency of the conventional BAW resonator corresponds to the low peak 511 (about 1.90 GHz). Also, the frequencies at the low peak 511 and the high peak 512 of the resonance curve 510 may be used to determine the coupling coefficient $kt^2$, as would be apparent to one skilled in the art, which in this example is about 6.0 percent. In comparison, the resonance curve 520 shows the admittance magnitude having a low peak 521 (series resonance frequency $f_s$) at about 4.88 GHz and a high peak 522 at about 4.95 GHz (parallel resonance frequency $f_p$). The resonance frequency of the BAW resonator according to the representative embodiment corresponds to the low peak 521 (about 4.88 GHz). Also, the frequencies at the low peak 521 and the high peak 522 of the resonance curve 520 may be used to determine the coupling coefficient $kt^2$, as would be apparent to one skilled in the art, which in this example is about 2.5 percent.

Notably, the resonance frequency of the BAW resonator having the monolithic piezoelectric layer with the opposite polarities is more than double the resonance frequency of the conventional BAW resonator. This is because the resonance frequency of the BAW resonator having the monolithic piezoelectric layer with the opposite polarities occurs at the second harmonic of the resonance frequency of the conventional BAW resonator. Also, while the resonance curve 510 indicates both a first harmonic (at about reference number 511) and a second harmonic (at about reference number 514), the resonance curve 520 does not include a first harmonic.

Further, the coupling coefficient $kt^2$ of 6.0 percent of the conventional BAW resonator is better than the coupling coefficient $kt^2$ of 2.5 percent of the BAW resonator having the monolithic piezoelectric layer with the opposite polarities, which is to be expected at the much lower resonance frequency. However, the coupling coefficient $kt^2$ of BAW resonator having the monolithic piezoelectric layer with opposite polarities may be increased by increasing the overall thickness of monolithic piezoelectric layer, while offsetting at least a portion of the increased thickness by decreasing the thicknesses of the first and second electrode layers. An improved coupling coefficient $kt^2$ of about 6.0 percent may be attained by these adjustments, while still maintaining the resonance frequency at about 4.88 GHz.

Figure 6:
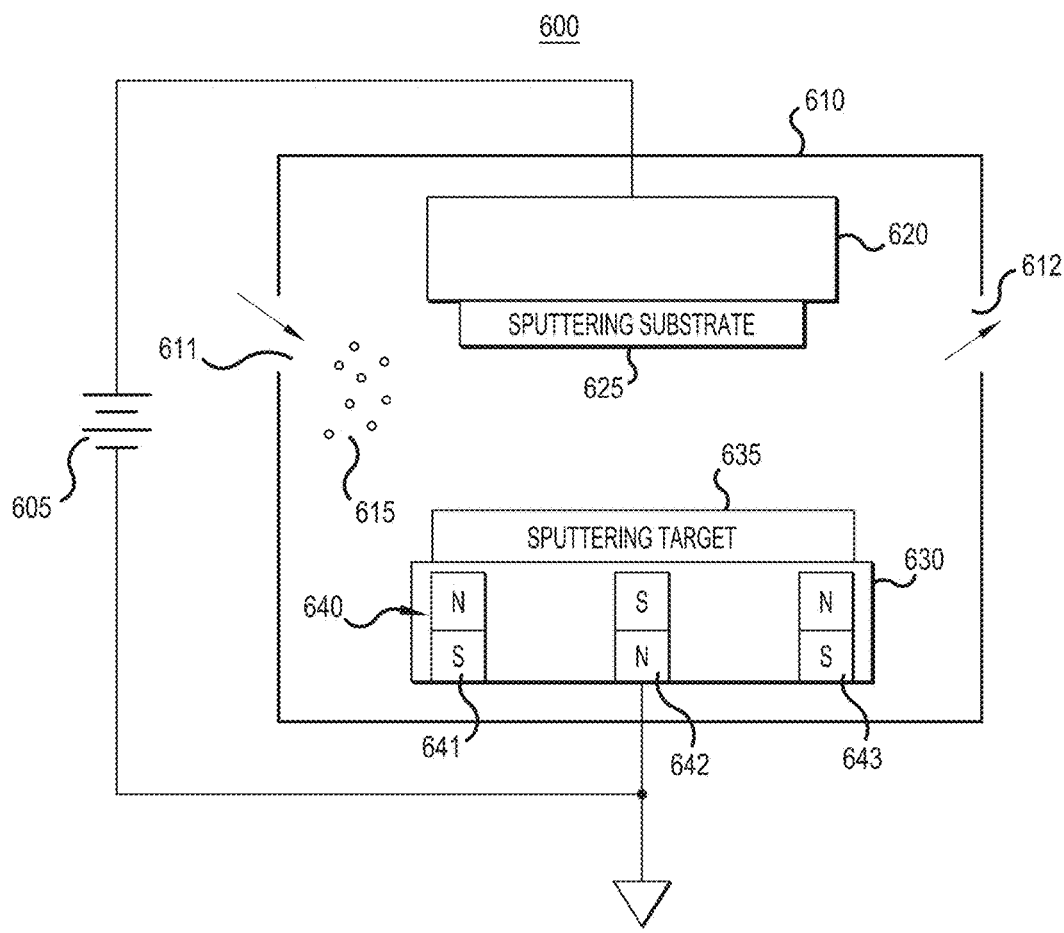
FIG. 6 is a simplified block diagram of a magnetron sputtering device for depositing a thin film of a material on a substrate, according to a representative embodiment.

FIG. 6 is a simplified block diagram of an illustrative magnetron sputtering device for depositing a thin film of a material on a sputtering substrate, according to a representative embodiment. An example of a magnetron sputtering device with enhanced magnetic field strengths and power densities is further described, for example, by Grannen et al., U.S. Patent Application Pub. No. 2015/0240349 (published Aug. 27, 2015), which is hereby incorporated by reference in its entirety.

Referring to FIG. 6, magnetron sputtering device 600 includes a reaction chamber 610 that contains a cathode 620 on which a (positively charged) sputtering substrate 625 is mounted, and an anode 630 on which a (negatively charged) sputtering target 635 is mounted. Power is applied across the cathode 620 and the anode 630 by DC voltage source 605. Power density of the power applied across the cathode 620 and the anode 630 may be in a range of about 20 W/cm² to about 60 W/cm², for example. The reaction chamber 610 further contains a magnetron 640 positioned adjacent the sputtering target 635. The magnetron 640 is configured to generate an enhanced magnetic field in the reaction chamber 610 running substantially parallel to a top surface of the sputtering target 635. In the depicted embodiment, the magnetron 640 is generally indicated by the north (N)/south (S) pole arrangements 641 and 643 at the outer portions of the anode 630, and the oppositely polarized S/N pole arrangement 642 at an inner portion of the anode 630. Generally, the magnetic field directs plasma formed in the reaction chamber 610 toward the sputtering target 635, as discussed below.

The sputtering substrate 625 may be a metal layer, such as an electrode layer, as discussed above, on a chip or a wafer (to be subsequently singulated). The sputtering target 635 likewise may be formed of various materials, depending on the desired composition of the resulting thin film For example, the sputtering target 635 may be formed entirely of a single element, such as aluminum (Al), or may be a compound formed of a base element, such as Al, with one or more doping elements (dopants), such as scandium (Sc), as discussed above. For example, if the desired composition of the thin film to be formed on the sputtering substrate 625 is AlN, where the nitrogen (N) is provided as a reaction gas included in sputtering gas 615, as discussed below, the sputtering target 635 is formed entirely of Al. If it is desired to sputter a thin film consisting of a compound of AlN doped with Sc (AlScN), for example, the target 635 may be formed of Al and Sc in proportions substantially the same as those desired in the resulting sputtered thin film. Alternatively, multiple targets may be provided, including the sputtering target 635 formed of a first material to be deposited as the thin film and another target (not shown) formed of a second material to be deposited as the thin film. The relative sizes of the multiple targets would correspond to the desired proportionate amounts of the materials in the sputtered thin film. The various embodiments contemplate incorporation of any rare earth elements through this disclosure. Further, other materials forming the sputtering substrate 625 and the sputtering target 635 may be incorporated without departing from the scope of the present teachings.

In an embodiment, the sputtering target 635 may be a previously formed alloy of materials provided in the desired proportions. For example, the sputtering target 635 may be an alloy formed of Al and one or more of rare earth element(s) (e.g., Sc) already mixed in with the Al in the desired proportions. In an alternative embodiment, the sputtering target 635 may be a composite sputtering target formed of a block of a base element containing inserts or plugs of doping element(s). For example, the doping element(s) may be introduced by drilling one or more holes in the base element and inserting plugs of the doping element(s) into the respective holes in the desired proportions. For example, the sputtering target 635 may be formed substantially of a block of Al as the base element, and plug(s) of doping element(s) (e.g., Sc) may be insertable into hole(s) previously formed in the block of Al. The percentage of each of the doping element(s) in the finished thin film corresponds to the collective volume of that element inserted into one or more respective holes, which displaces a corresponding volume of the base element. The size and number of holes, as well as the amount and type of the doping element filling each of the holes, may be determined on a case-by-case basis, depending on the desired percentages of the doping elements.

In operation, sputtering gas 615 enters input 611 and exits output 612 of the reaction chamber 610. The sputtering gas 615 includes at least an inert gas of neutral atoms, such as argon (Ar). Generally, power (voltage) is applied across the anode 630 and the cathode 620 by the DC voltage source 605 to create an electric field within the reaction chamber 610, causing the sputtering gas 615 to form plasma. That is, the electric field ionizes the neutral atoms of the inert gas. The resulting ions from the plasma bombard the negatively charged sputtering target 635 on the anode 630. Collisions between the ions and the surface of the target 635 cause atoms and electrons to be ejected (sputtered) from the sputtering target 635. A portion of the ejected atoms (or elements) travel through the reaction chamber 610 and are deposited on the surface of the substrate 625, gradually building up a layer of sputtered material to form the thin film. Meanwhile, the ejected electrons are held close to the surface of the target 635 by the magnetic field (magnetic envelop) generated by magnetron 640. The presence of these trapped electrons generally increases arrival energy and plasma density, which improves sputter deposition rates.

The sputtering gas 615 also includes one or more reaction gases, such as $N_2$ in the case of sputtering a thin film of AlN, where the sputtering target 635 comprises Al. Also, during the predetermined period of time in the second phase of the deposition sequence, discussed above, during which a predetermined amount of oxygen containing gas is added to the gas atmosphere in the reaction chamber 610, the sputtering gas 615 also includes the diatomic or triatomic oxygen which causes the polarity to invert. In various configurations, the oxygen containing gas may enter through the input 611 with the other gases on the sputtering gas 615 during the predetermined period of time, or through a separate input (not shown) dedicated to the addition of the oxygen containing gas. Atoms of the reaction gas are also deposited on the surface of the substrate 625, along with the atoms ejected from the target 635. Of course, different mixes and types of inert and/or reaction gases may be included without departing from the scope of the present teachings.

Thus, generally, the disclosure relates to methods to create a single, monolithic piezoelectric layer of AlN and/or doped AlN (e.g., AlScN) with a top half of the monolithic piezoelectric layer having a positive polarity (e.g., opposite) from a bottom half of the monolithic piezoelectric layer having a negative polarity. By one monolithic piezoelectric layer with two different polarities, a BAW resonator including this monolithic piezoelectric layer resonates at the second harmonic frequency instead of the first harmonic, which enables construction of filters, for example, capable of operating at much higher frequencies.

In various embodiments, AlN or doped AlN (e.g., AlScN) is reactively sputtered using a planar magnetron system, as well as a gas atmosphere comprising Ar and $N_2$ source gases flowing into a reaction chamber of the planar magnetron system. The resulting piezoelectric layer initially grows on a metal electrode, for example, with a negative polarity. Then, with the sputter deposition sequence still running, a small amount of oxygen is added to the gas atmosphere (e.g., Ar—N mixture) for a short period of time. After the short period of time, the oxygen flow is terminated, leaving only the continuing flow of the Ar and $N_2$ source gases. The addition of this small amount of oxygen is sufficient to invert the polarity of the growing aluminum nitride film. That is, the polarity of the AlN inverts, induced by the oxygen admitted into the reaction chamber, and becomes a positive polarity, and the AlN continues to grow in the positive polarity orientation until the end of the sputter deposition sequence. There is no discernible interface, in cross-sectional physical analysis, between the two different crystal polarities in the completed monolithic piezoelectric layer. A resonator device made with this arrangement of crystal polarities has been demonstrated to resonate at is more than twice the resonance frequency of a single piezoelectric layer composed of one crystal orientation, as discussed above.

One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A method of forming a bulk acoustic wave (BAW) resonator, comprising:
   depositing a first electrode layer over a resonator substrate and an acoustic reflector;
   depositing a piezoelectric layer on the first electrode layer during a continuous deposition sequence, wherein depositing the piezoelectric layer comprises:
      sputtering aluminum nitride (AlN) on the first electrode layer inside a reaction chamber having a gas atmosphere for a first period of time corresponding to the continuous deposition sequence, the gas atmosphere comprising nitrogen ($N_2$) gas and argon (Ar) gas, causing growth of the piezoelectric layer with a polarity in a negative direction; and
      adding a predetermined amount of oxygen gas, comprising oxygen ($O_2$) gas or ozone ($O_3$) gas, to the gas atmosphere over a predetermined second period of time, less than the first period of time, while continuing the sputtering of the aluminum nitride (AlN) onto the first electrode layer while adding the predetermined amount of oxygen gas and during a remainder of the continuous deposition sequence after the predetermined second period of time, such that the piezoelectric layer is monolithic, wherein the predetermined amount of oxygen gas causes the polarity of the piezoelectric layer to invert from the negative direction to a positive direction, opposite the negative direction, for the remainder of the continuous deposition sequence, and wherein the polarity in the negative direction is directed substantially toward the first electrode layer, and the polarity in the positive direction is directed substantially away from the first electrode layer; and
   depositing a second electrode layer over the piezoelectric layer,
   wherein the predetermined amount of oxygen gas added to the gas atmosphere is in a range from about 50 micromoles to about 5 millimoles, and wherein the predetermined second period of time is in a range from about one (1) second to about sixty (60) seconds.

2. The method of claim 1, wherein there is no discernible interface in the piezoelectric layer where the polarity of the piezoelectric layer inverts from the negative direction to the positive direction.

3. The method of claim 1, wherein the first electrode layer is formed of one of molybdenum (Mo) or tungsten (W).

4. The method of claim 1, wherein adding the predetermined amount of oxygen gas causes the polarity of the piezoelectric layer to invert at half way through the continuous deposition sequence, such that a first half of the piezoelectric layer has the polarity in the negative direction and a second half of the piezoelectric layer has the polarity in the positive direction.

5. The method of claim 4, wherein the piezoelectric layer, having the first half with the polarity in the negative direction and the second half with the polarity in the positive direction, causes the BAW resonator to resonate at a second harmonic of a resonance frequency of the BAW resonator, as opposed to a first harmonic of the resonance frequency.

6. The method of claim 5, wherein by resonating at the second harmonic, the BAW resonator resonates at a frequency over twice the resonance frequency of a BAW resonator without a monolithic piezoelectric layer having different polarities, but having a piezoelectric layer with the same thickness.

7. The method of claim 1, wherein the acoustic reflector comprises an air cavity formed in the resonator substrate.

8. The method of claim 1, wherein the acoustic reflector comprises a distributed Bragg reflector (DBR).

\* \* \* \* \*